United States Patent [19]
Cachier et al.

[11] 4,028,556
[45] June 7, 1977

[54] HIGH-SPEED, LOW CONSUMPTION INTEGRATED LOGIC CIRCUIT

[75] Inventors: Gérard Cachier; Jean Paul Puron, both of Paris, France

[73] Assignee: Thomson-CSF, Paris, France

[22] Filed: Mar. 12, 1975

[21] Appl. No.: 557,784

[30]     Foreign Application Priority Data

Mar. 12, 1974   France ............................. 74.08256

[52] U.S. Cl. ............................... 307/205; 307/214; 307/215; 307/304
[51] Int. Cl.² ................. H03K 19/08; H03K 19/34; H03K 19/36
[58] Field of Search ........... 307/205, 214, 215, 304

[56]     References Cited
    UNITED STATES PATENTS

| | | | |
|---|---|---|---|
| 3,250,917 | 5/1966 | Hofstein | 307/214 X |
| 3,299,291 | 1/1967 | Warner, Jr. et al. | 307/215 X |
| 3,619,670 | 11/1971 | Heimbigner | 307/215 X |
| 3,700,981 | 9/1972 | Masuhara et al. | 307/205 X |
| 3,832,574 | 8/1974 | Leehan | 307/215 X |

*Primary Examiner*—John Zazworsky
*Attorney, Agent, or Firm*—Cushman, Darby & Cushman

[57]     ABSTRACT

A NOR or a NAND gate of integrated circuit type, having a fan-out of at least three and with a propagation time in the order of 1 nanosecond for a power consumption of a fraction of a milliwatt, is provided. The gate comprises an inverter stage supplied by a saturable load, and an amplifier stage injecting into a diode and into a saturable load connected in such a fashion as to effect a voltage shift. At the input, there are field-effect transistors of low threshold voltage (−0.2 volts), drawing two microamps at zero gate voltage. For the remainder of the circuit, field-effect transistors having a higher absolute threshold voltage (−0.6 volts) are used, these being designed to draw a very low current at a supply voltage of 1.5 volt.

3 Claims, 5 Drawing Figures

HIGH-SPEED, LOW CONSUMPTION INTEGRATED LOGIC CIRCUIT

The present invention relates to very fast, low-consumption integrated logic circuits. It relates in particular to NOR and NAND-gates. These gates should be capable of being manufactured on one and the same silicon wafer, and should in addition:

1. be compatible, that is to say capable of being connected in series, the output signals from one element in the series being capable of controlling the next element;
2. be capable of effecting parallel control of several identical logic circuits connected in parallel at their outputs. In other words, these gates should exhibit a certain fan-out factor of the order of several units.

It is currently possible, using the known means, to produce such circuits although a certain compromise has to be made between their fan-out, or the power which they consume, and their switching speed the latter being determined by the time of propagation of a piece of information through the logic circuit, or in other words the $t_{pd}$ (time propagation delay). The merit of the compromise is sometimes expressed by the terms "merit factor," this being the product in picojoules of the power consumed in milliwatts and the $t_{pd}$ in nanosecond. The compromise is better the smaller this product is.

The invention makes it possible to obtain circuits having a merit factor corresponding to a product of the order of 1/10 of a picojoule, that is to say a result which is substantially better than that obtainable with the known embodiments. According to the present invention, there is provided an integrated logic circuit consisting of a first stage comprising at least two field-effect input transistors and of of a second stage comprising at least one field-effect output transistor, said input transistors having a consumption power and a threshold voltage substantially lower than those of said output transistor.

The invention will be better understood and other of its features rendered apparent, from a consideration of the ensuing description and the attached drawings in which.

Figure 1:
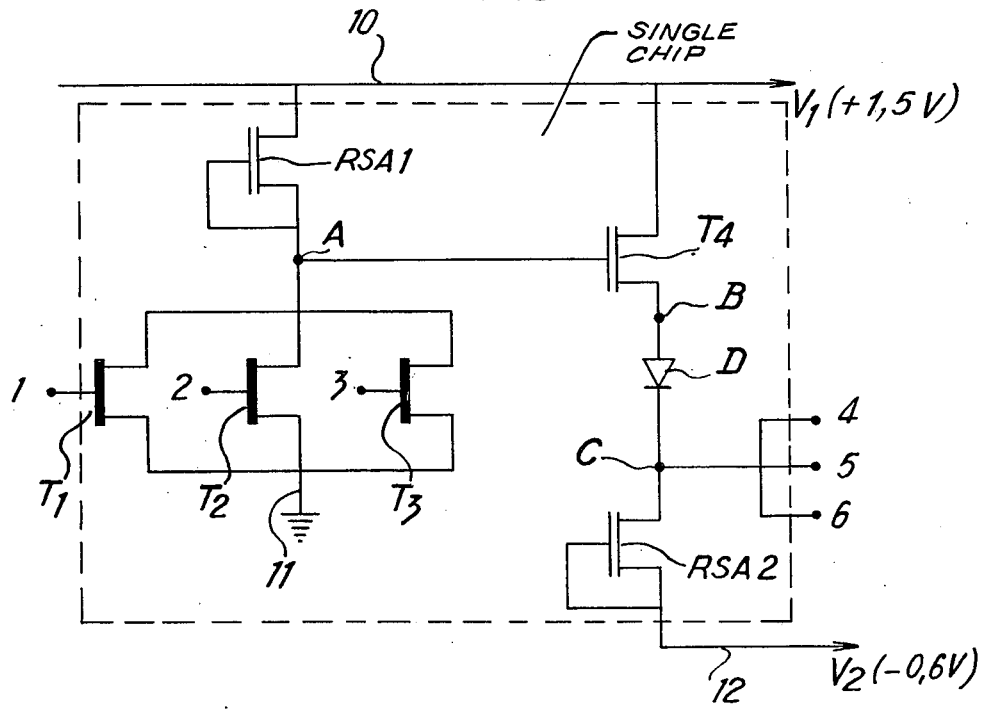
FIGS. 1 and 5 are circuit diagrams in accordance with the invention.

FIG. 1 is the equivalent electrical diagram of an integrated circuit element constituting an example of a NOR-gate in accordance, with the invention. Three field-effect transistors $T_1$, $T_2$, $T_3$ with N-type channels, are connected in parallel in such a fashion that their "drain-source", interval is connected between a point A (drain side) and earth 11 (source side). The gates of these transistors are respectively connected to studs, 1, 2 and 3 constituting three inputs of the NOR gate. Point A is connected to the source, itself connected to the gate, of a transistor $RSA_1$ (connected to act as a saturable load) whose drain is connected, by a conductor 10, to the positive terminal of a supply source (not shown) supplying a direct voltage $V_1$ (+ 1.5 volts). That branch of the circuit which passes via the point A just described, constitutes the first stage of the NOR-gate. Between the conductor 10 and a conductor 12 connected to the negative terminal of a direct supply source $V_2$ (− 0.6 volts) not shown there are arranged in series:

the "drain source" interval of a transistor $T_4$,
the "anode-cathode" interval of a diode D,
the "drain-source" interval of a transistor $RSA_2$, connected as a saturable load (gate connected to source).

The point A is connected to the gate of $T_4$. The point C, connected to the cathode of the diode D and to the drain of the transistor $RSA_2$, is connected to three studs 4, 5 and 6 constituting three outputs of the gate. The point B of the source of $T_4$, is simply an intermediate point in the diagram. That branch of the circuit which passes via the point B constitutes the second stage of the NOR gate.

In the case of the present invention, the field-effect transistors in the circuit are:

of the low threshold voltage type (for example − 0.2 volts) as far as the three input transistors $T_1$, $T_2$ and $T_3$ are concerned;

of the clearly negative threshold type (−0.6 volts) for example as far as the output transistor $T_4$ and the transistors connected as saturable load, are concerned.

In the example shown in FIG. 1, the transistors $T_1$, $T_2$ and $T_3$ are of the SCHOTTKY gate kind and are designed in order to pass a "drain-source" current:

of less than 2 microamps for a gate-source voltage of the order of −0.4 volts;

of less than 25 microamps, taking into account the saturable load, at a gate-source voltage of + 0.4 volts.

As far as the transistors of the aforementioned second type are concerned, these are designed in order, for a zero gate voltage, to pass a current of:

around 20 milliamps in the case of $RSA_1$;
around 40 milliamps in the case of $T_4$ and $RSA_2$.

Figures 2, 3:
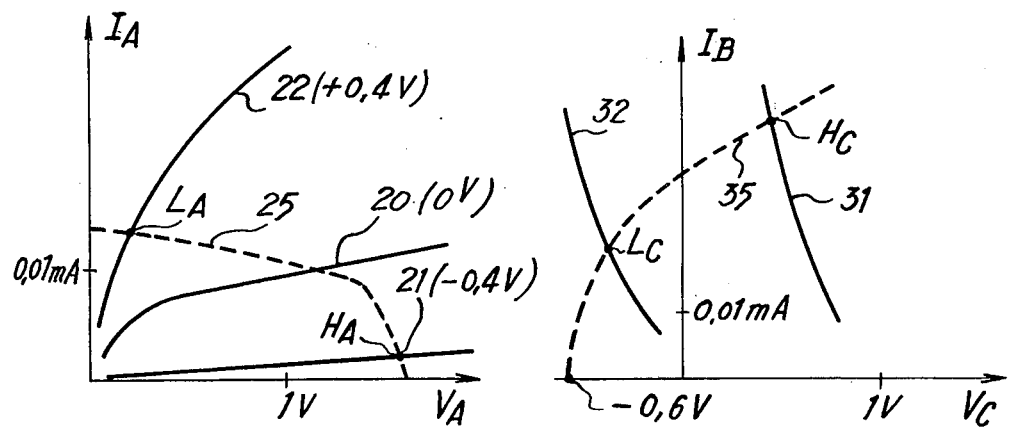
FIGS. 2, 3 and 4 are explanatory graphs.

The operation of a gate of the kind shown in FIG. 1 is wellknown as far as the succession of logic states is concerned. However, the levels achieved and the corresponding supply currents, constitute an advantageous result of the invention. FIGS. 2 and 3 illustrate this for example.

FIG. 2 illustrates in a "current-voltage" diagram, the characteristic graphs of the "drain-source" current ($I_A$) for the transistors of the branch passing via A (the gate current of $T_4$ being assumed to be negligible) as a function of the voltage $V_A$ between A and earth. For each of them considered separately, the characteristic is as follows:

a graph 25 in the form of a broken line for $RSA_1$;
a graph 20, or 21 or 22 in full line, in the case of the potential is 0 volt or − 0.4 volt or + 0.4 volt.

If the two transistors are connected in series as in the left-hand branch of the diagram shown in FIG. 1, then an "inverter" is obtained, giving output levels corresponding to the input levels specified in the following table:

| Potential levels | Input 1 | Output A |
|---|---|---|
| | Low | High |
| | High | Low |

In the case of the chosen example, the values of these levels are given by the intersections between the graphs 21 and 22, and the graph 25, in other words:

| Input 1 | Output A |
|---|---|
| $V_B = - 0.4$ volt | $V_A = 1.5$ volt (point $H_A$) |

-continued

| Input 1 | Output A |
|---|---|
| $V_B = +0.4$ volt | $V_A = 0.1$ volt (point $L_A$) |

The function of the right-hand branch, incorporating $T_4$, D and $RSA_2$, is to render the overall circuit compatible and furthermore to supply the requisite power to ensure a certain output load factor. It plays the dual role of amplifier and voltage-shift device.

FIG. 3 enables the corresponding tables to be drawn up for the overall circuit of FIG. 1, by giving the electrical levels in the "high" and "low" states, respectively at A and at C. The graph 35, in broken-line, is the graph of the transistor $RSA_2$, considered separately between C and $V_2$. The graphs 31 and 32, in full-line are the graphs for a series circuit comprising the transistor $T_4$ and the diode D.

The graph 31 corresponds to:

$$V_A = 1.5 \text{ volt};$$

and the graph 32 corresponds to:

$$V_A = 0.2 \text{ volt}.$$

The points of intersection with the graph 35, namely at Hc and $L_C$, correspond to the output voltages:

$$V_C = +0.4 \text{ volt}$$

and $$V_C = -0.4 \text{ volt}.$$

| Input 1 | Output C |
|---|---|
| −0.4 volts | +0.4 volts |
| +0.4 volts | −0.4 volts |

It will be observed, furthermore, that the current $I_B$ in the right-hand branch is heavier than that $I_A$ in the left-hand branch, for the same state, low or high. However, the power consumed overall, remains very low, of the order of 0.1 milliwatt.

Figure 4:
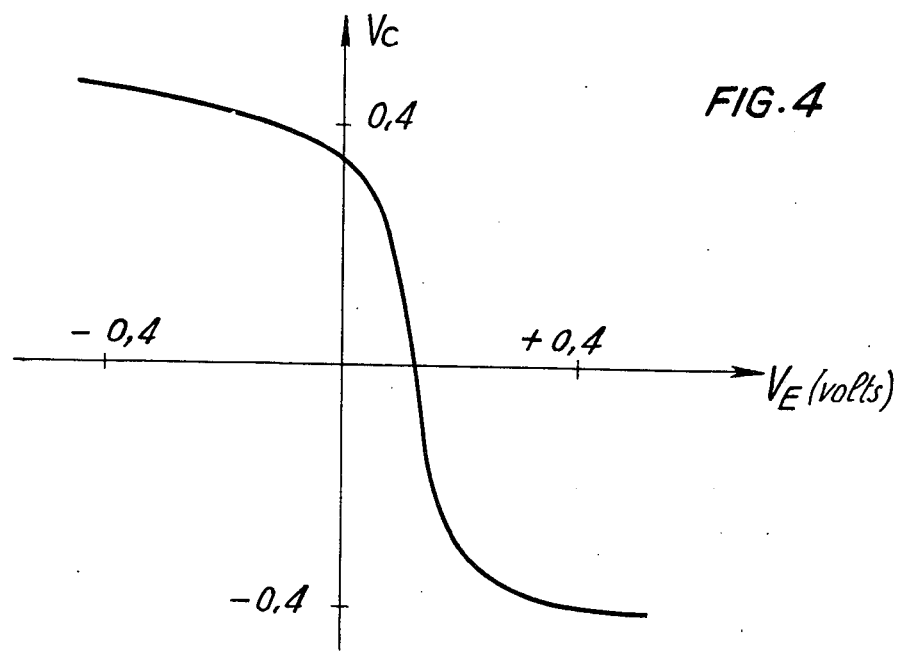

The transfer characteristic of the NOR-gate is given by the graph shown in FIG. 4 where the abscissae plot the input voltages $V_E$ and the ordinates the output voltages $V_C$. A graph having this form gives good protection against noise components. The manufacture of the transistors $T_1$, $T_2$ and $T_3$, which are distinguished by their low threshold voltage (0.2 volts) and the fact that their switching time is less than 1 nanosecond is facilitated by the ion implantation technique as far as the N-type conduction channel is concerned. The capacitances of the source and drain electrodes can in this case be very substantially reduced as also can the length of the conduction channel and this promotes the switching speed.

Transistors of this kind can be manufactured in integrated circuit form on a substrate having a resistivity of around 100 ohm-cm.

The performance figures for a three-input and three-output NOR-gate in accordance with the invention, may be as follows: $t_{pd} = 0.8$ nanosecond, or, for a mean power of 0.15 milliwatt: W × $t_{pd} = 0.12$ picojoule.

Figure 5:
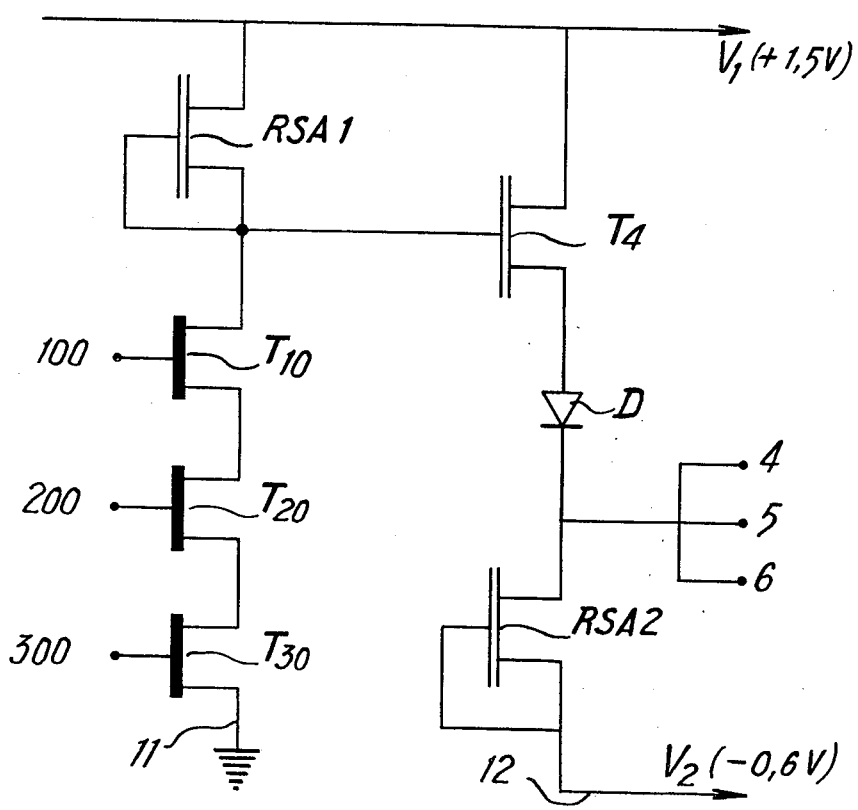

In a variant embodiment of the invention, the input transistors are connected in series and not in parallel, between the point A and earth 11. In this fashion, a NAND-gate, is obtained, as shown in FIG. 5. In the drawing, there are to be found in series the "drain-source" intervals of three transistors $T_{10}$, $T_{20}$, $T_{30}$ which are of identical type to those $T_1$, $T_2$ and $T_3$. The gates 100, 200 and 300 of these transistors represent the three inputs of the NAND gate. The other elements of this gate are identical to those of the circuit shown in FIG. 1. In a variant embodiment which has not then shown, the three input transistors of the NAND gate are replaced by a single three-gate transistor.

The performance figures for these NAND gates are substantially the same if the technology used is the same as in the foregoing examples.

In other variant embodiments of the invention, the SCHOTTKY gate transistors are replaced by PN or NP junction type transistors or by M.O.S. transistors with insulated gates (metal oxide- semi-conductor transistors).

If field-effect transistors with P-type channels were to be used instead of ones having N-type channels as in the preceding examples, then the polarities of the supply sources would have to be reversed as also would the direction of the output diode. The results obtained would be poorer as far as switching speed is concerned.

Finally, in a variant embodiment of lower performance, lower that is in terms of the transfer characteristic, the diode in the output branch is replaced by a simple resistor.

What we claim is:
1. An integrated logic circuit, comprising a plurality of semiconductor elements on a single chip,
   a. said plurality of elements include a plurality of input field effect transistors with gates for separately receiving "high" and "low" logic potential levels symmetrical with respect to the ground potential level, sources connected to the ground terminal, and drains in common connected through a first node and a first saturable load to a first supply source of a predetermined polarity;
   b. wherein said input transistors have a first threshold voltage;
   c. wherein said plurality of elements further include an output field effect transistor with its gate connected to said first node, its drain directly connected to said first supply source and its source connected to a second node through a diode, said second node being connected through a second saturable load to a second supply source whose polarity is opposite to the polarity of said first supply source;
   d. wherein said output transistor has a second threshold voltage greater in absolute magnitude than said first threshold voltage;
   e. wherein said second node constitutes the output terminal of the logic circuit on which are to be collected output potential levels respectively corresponding to said "high" and "low" logic potential levels received at the gate of any input field effect transistor;
   f. wherein said first and second threshold voltages are arranged so that said output potential levels are the opposite of the algebraic values of said "high" and "low" logic potential levels and of the same absolute magnitude.

2. An integrated logic circuit as claimed in claim 1, wherein said saturable loads consist of field effect transistors each of them having its gate connected to its source, the terminals of each load consisting of the drain and the source of said load field effect transistor.

3. An integrated logic circuit as claimed in claim 1, wherein the dimensions of said input transistors are smaller than the dimensions of said output transistor, so that the current passing through the drain of input transistors is always smaller than the current passing through the drain of said output transistor.

* * * * *